(12) United States Patent
Roy et al.

(10) Patent No.: US 11,978,756 B2
(45) Date of Patent: *May 7, 2024

(54) ELECTRONIC DEVICE IMAGE SENSOR

(71) Applicant: STMicroelectronics (Crolles 2) SAS, Crolles (FR)

(72) Inventors: Francois Roy, Seyssins (FR); Sonarith Chhun, Pontcharra (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 583 days.

This patent is subject to a terminal disclaimer.

(21) Appl. No.: 17/128,608

(22) Filed: Dec. 21, 2020

(65) Prior Publication Data

US 2021/0111215 A1 Apr. 15, 2021

Related U.S. Application Data

(62) Division of application No. 16/212,790, filed on Dec. 7, 2018, now Pat. No. 10,910,428.

(30) Foreign Application Priority Data

Dec. 8, 2017 (FR) ...................................... 1761836

(51) Int. Cl.
*H01L 27/146* (2006.01)

(52) U.S. Cl.
CPC .. *H01L 27/14636* (2013.01); *H01L 27/14632* (2013.01); *H01L 27/14685* (2013.01); *H01L 27/14687* (2013.01); *H01L 27/1464* (2013.01)

(58) Field of Classification Search
CPC ......... H01L 27/14636; H01L 27/14632; H01L 27/14685; H01L 27/14687; H01L 27/1464
See application file for complete search history.

(56) References Cited

U.S. PATENT DOCUMENTS 9,520,435 B2 12/2016 Ahmed et al.
10,910,428 B2 * 2/2021 Roy .................. H01L 27/14636
(Continued)

FOREIGN PATENT DOCUMENTS

CN 101640207 A 2/2010
CN 102270646 A 12/2011
(Continued)

OTHER PUBLICATIONS

INPI Search Report and Written Opinion for FR 1761836 dated Jul. 12, 2018 (8 pages).
(Continued)

*Primary Examiner* — Vu A Vu
*Assistant Examiner* — Valerie N Newton
(74) *Attorney, Agent, or Firm* — Crowe & Dunlevy LLC

(57) ABSTRACT

An electronic device includes a substrate semiconductor wafer with semiconductor portions separated from one another by through-passages. Electronic circuits and a dielectric layer with a network of electrical connections are formed at a front face of the substrate semiconductor wafer. Electrically conductive fillings are contained within the through-passages and are connected to the network of electrical connections. Interior dielectric layers for anti-diffusion protection are provided in the through-passages between the electrically conductive fillings and the semiconductor portions. Back side dielectric layers are joined to the interior dielectric layers.

18 Claims, 10 Drawing Sheets

(56) References Cited

U.S. PATENT DOCUMENTS

| | | |
|---|---|---|
| 2004/0089914 A1 | 5/2004 | Mouli et al. |
| 2006/0001120 A1 | 1/2006 | Wright |
| 2006/0043438 A1 | 3/2006 | Holm et al. |
| 2009/0184384 A1 | 7/2009 | Sanfilippo et al. |
| 2010/0006908 A1 | 1/2010 | Brady |
| 2014/0151840 A1 | 6/2014 | Cheng |
| 2015/0035103 A1 | 2/2015 | Inoue |
| 2015/0061102 A1 | 3/2015 | Lin et al. |
| 2015/0279878 A1 | 10/2015 | Ahmed et al. |
| 2016/0172404 A1 | 6/2016 | Ahmed et al. |
| 2016/0379936 A1 | 12/2016 | Spitzlsperger et al. |
| 2017/0040357 A1 | 2/2017 | Yu et al. |

FOREIGN PATENT DOCUMENTS

| | | |
|---|---|---|
| CN | 102544038 A | 7/2012 |
| CN | 103026483 A | 4/2013 |
| CN | 209389037 U | 9/2019 |
| FR | 2968130 A1 | 6/2012 |
| KR | 20120122636 A | 11/2012 |

OTHER PUBLICATIONS

First Office Action and Search Report for counterpart CN Appl. No. 201811420437.5, dated Jan. 28, 2023, 8 pgs.
Second Office Action and Search Report for counterpart CN Appl. No. 201811420437.5, report dated Jul. 27, 2023, 6 pgs.

* cited by examiner

ELECTRONIC DEVICE IMAGE SENSOR

CROSS REFERENCE TO RELATED APPLICATIONS

This application is a divisional of U.S. patent application Ser. No. 16/212,790 filed Dec. 7, 2018, which claims the priority benefit of French Application for Patent No. 1761836, filed on Dec. 8, 2017, the contents of which are hereby incorporated by reference in their entireties to the maximum extent allowable by law.

TECHNICAL FIELD

Various embodiments relate to the field of electronic devices and, in particular, to image sensors.

BACKGROUND

Currently, such devices are obtained by fabricating electronic circuits and a dielectric layer including a network of electrical connections on a front face of a substrate wafer and by subsequently forming trenches in the substrate wafer starting from the back face of the latter, these trenches then being filled with a metal.

SUMMARY

According to one embodiment, an electronic device, image sensor, is provided which comprises: a semiconductor substrate wafer having a front face and a back face and comprising portions separated from one another forming through-passages; electronic circuits and a dielectric layer including a network of electrical connections that is situated on top of the front face of the substrate wafer; electrically conductive fillings connected to the network of electrical connections that are contained within the through-passages and running toward the back from the front face; and dielectric layers for anti-diffusion of the metal of the fillings into the semiconductor substrate wafer, these anti-diffusion layers comprising interior layers that are situated between the sides of the portions of the semiconductor substrate wafer and the fillings and back layers joined to the interior layers.

The dielectric anti-diffusion layers may comprise back layers covering the back faces of the portions of the substrate wafer and attached to the interior layers.

The dielectric anti-diffusion layers may comprise back layers within the through-passages which are attached to the interior layers.

The back layers may have local back cavities containing local additional layers of a metal.

The local additional layers of metal contained within the cavities may be attached to the tungsten layers of the fillings.

The local additional layers of metal contained within the cavities may have portions aligned with the through-passages and may be separated from metal layers of the fillings by local additional insulating layers in back portions of the through-passages.

The fillings may comprise front layers of polysilicon and back layers of a metal.

The fillings may comprise back parts made of tungsten.

The fillings of the through-passages may comprise front parts made of doped polysilicon.

The fillings may comprise back parts made of doped polysilicon.

The dielectric anti-diffusion layers may be of silicon oxide.

A method is also provided for fabrication of an electronic device, which comprises:

forming deep main grooves in a thick bulk substrate wafer, starting from a front face of this wafer, these deep main grooves running in longitudinal and transverse directions and intersecting one another; forming dielectric anti-diffusion layers against the sides and bases of the deep grooves and temporary fillings within secondary grooves formed in these dielectric layers; fabricating electronic circuits and a dielectric layer, including a network of electrical connections, on top of the front face of the substrate wafer, this network being electrically connected to the temporary fillings; thinning the thick substrate wafer starting from its back face down to the back faces of the temporary fillings, removing the back parts of the dielectric layers, so as to obtain the interior anti-diffusion layers and the portions of the substrate wafer; removing the temporary fillings; and forming the back anti-diffusion layers.

The method may comprise the following steps: after obtaining the interior layers, continue with the thinning of the thick substrate wafer until the portions of the substrate wafer are obtained; and forming the back layers of the dielectric anti-diffusion layers on the back faces of the portions of the substrate wafer, attached to the interior layers.

The method may comprise the following step: replacing back parts of the temporary fillings with back anti-diffusion layers in the through-passages.

The method may comprise the following step: forming back cavities in the back layers and filling these cavities with a metal.

BRIEF DESCRIPTION OF THE DRAWINGS

Electronic devices, image sensors, and modes of fabrication will now be described by way of non-limiting examples, illustrated by the drawings in which.

DETAILED DESCRIPTION

Figure 1:
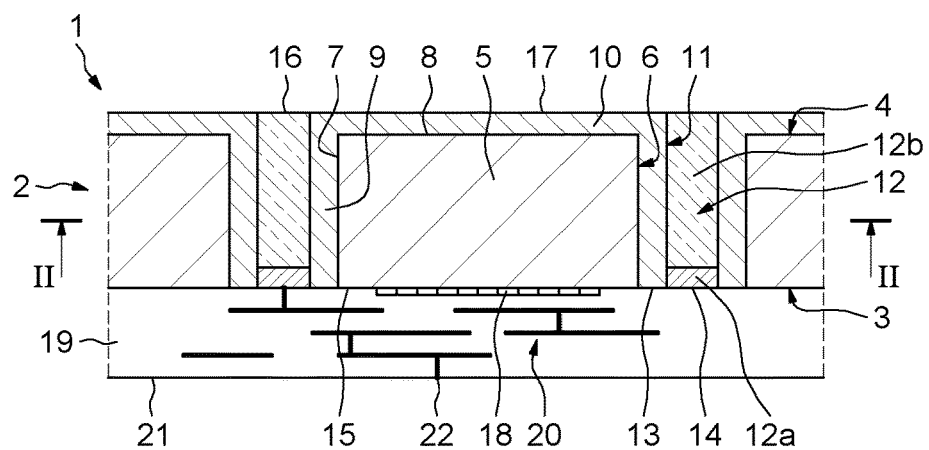
FIG. 1 shows a transverse cross-section of an electronic device, along I-I in FIG. 2.
Figure 2:
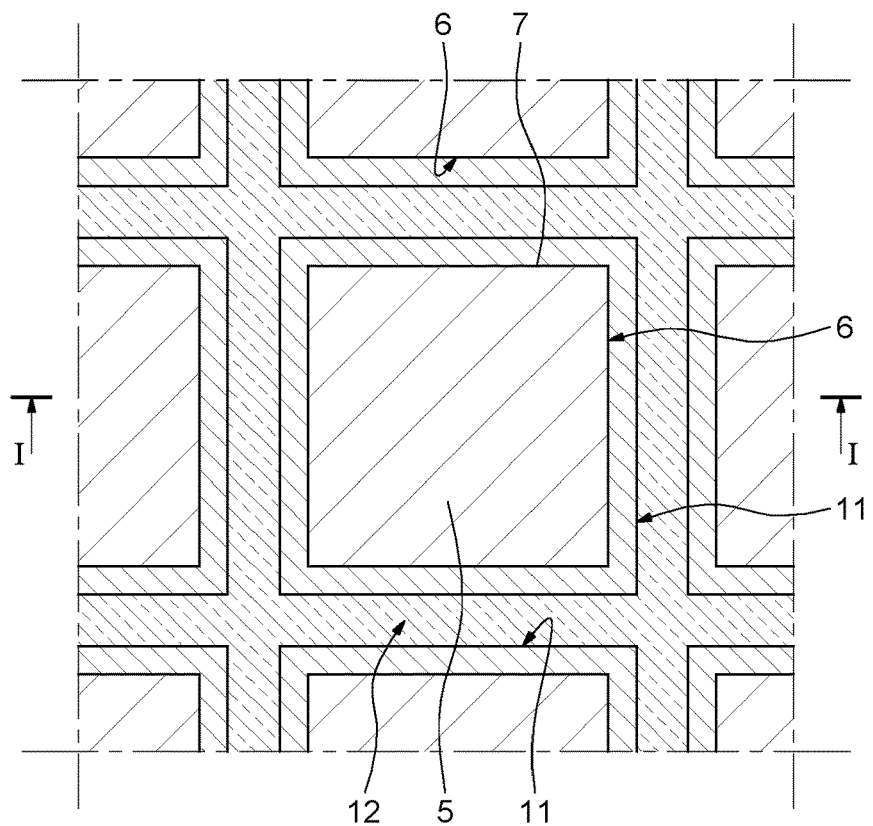
FIG. 2 shows a plan cross-section of the electronic device in FIG. 1, along II-II in FIG. 1.

According to one embodiment illustrated in FIGS. 1 and 2, an electronic device 1, which is for example an image sensor, comprises a substrate semiconductor wafer 2 whose thickness is reduced (thinned), wherein the wafer is for example made of silicon, and which, generally speaking, has a front side 3 and a back side 4.

The substrate wafer 2 comprises a plurality of semiconductor portions 5 separated from one another by main through-passages 6 which pass through the substrate wafer 2 from one face to the other and which run in a longitudinal and transverse direction intersecting one another. The portions 5 are at equal distances from one another in such a manner that the portions 5 have a disposition in the form of a square, rectangular, hexagonal, or more complex mosaic.

The sides 7 of the portions 5, situated within the main through-passages 6, and the back faces 8 of the portions 5, situated on the back side 4, are respectively covered by interior dielectric anti-diffusion layers 9 and by back dielectric anti-diffusion layers 10 which are joined together. The interior layers 9 respectively go around the portions 5. Secondary through-passages 11 pass through the substrate wafer 2, between the interior layers 9 respectively of the portions 5 and run in a longitudinal and transverse direction intersecting one another. The interior dielectric layers 9 and the back dielectric layers 10 are for example made of silicon oxide.

The secondary through-passages 11 are filled with a filling 12 that is made of at least one electrically conductive material. The conductive fillings 12 run in the form of longitudinal and transverse bars intersecting one another.

The front faces 13 of the interior dielectric layers 9 and the front face 14 of the conductive fillings 12 are co-planar with the front faces 15 of the portions 5, situated on the front side 3 of the substrate wafer 2. The back face 16 of the conductive fillings 12 is co-planar with the back faces 17 of the back dielectric layers 10.

Advantageously, the conductive fillings 12 comprise front parts 12a, forming electrically conductive front plugs, for example made of a doped polysilicon and back parts 12b made of metal, for example of tungsten. Nevertheless, the back parts 12b could be of copper or of another metal.

Locally, on the front side 3 of the substrate wafer 2, the electronic device 1 comprises electronic integrated circuits 18 situated and formed only on and in the front faces 15 of the portions 5, these electronic circuits 18 including transistors and photodiodes. The electronic circuits 18 do not extend over the local longitudinal and transverse regions, including the main through-passages 6.

Over the entirety of the front side 3 of the substrate wafer 2, the electronic device 1 comprises a front layer 19 of a dielectric material including a network of electrical connections 20 which comprises several metal levels selectively connected together.

The network 20 is selectively connected to the electronic circuits 18 and is connected to the conductive fillings 12, more particularly to the front face of the front part 12a. On the front external face 21 of the front layer 19, front lugs 22 are provided with a view to making external electrical connections to the device 1.

The electronic device 1 which has just been described forms an image sensor designed to sense the light reaching its back face, which include the associated electronic circuits 18 as well as vertical MOS capacitors which are defined in the main through-passages 6, forming pixels intended to define a matrix digital image.

By virtue of the dispositions of the electronic device 1 described hereinabove, a passivation of the internal interfaces and a mutual isolation between the pixels are obtained.

Furthermore, the back parts 12b of the conductive fillings 12 and the portions 5 of the substrate wafer 2 do not both at the same time have exposed surfaces or regions, in such a manner that the metal (for example, tungsten) forming the back parts 12b of the conductive fillings 12 cannot contaminate the semiconductor material (for example, silicon) forming the portions 5 of the substrate wafer 2 owing to the existence of the interior dielectric layers 9 and of the back dielectric layers 10 which form diffusion barriers. Furthermore, the back parts 12b form screens against the light.

The electronic device 1 may be fabricated in the following manner.

Figure 3:
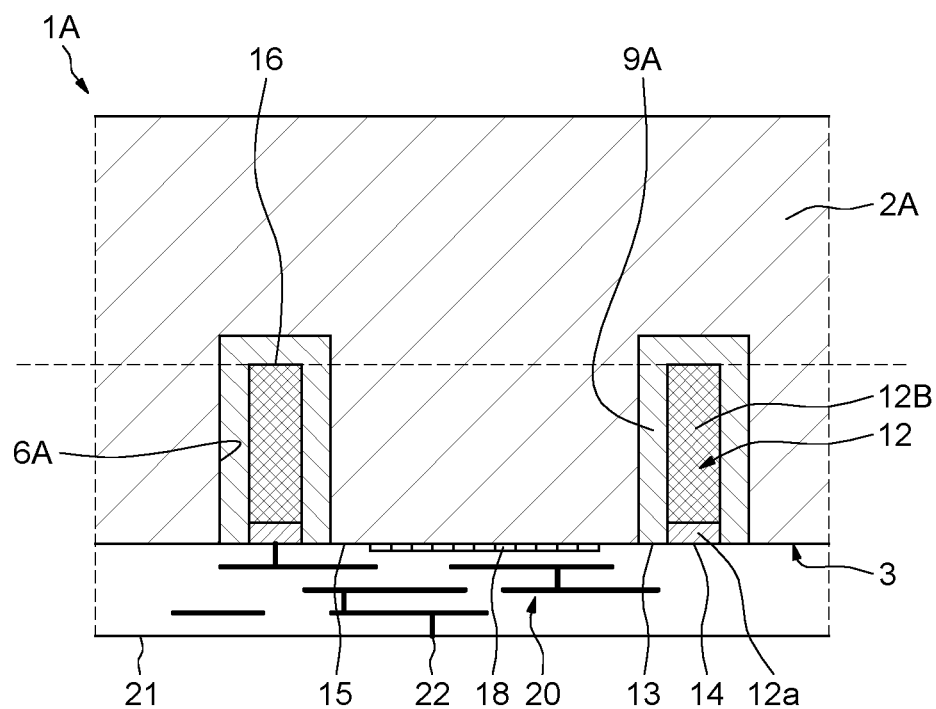
FIGS. 3 to 9 show transverse cross-sections of the electronic device in FIG. 1, according to fabrication steps.

As illustrated in FIG. 3, a device 1A is provided which comprises a bulk substrate wafer 2A made of silicon, much thicker than the substrate wafer 2 to be obtained, the substrate wafer 2A having the front side 3 of the substrate wafer 2 to be obtained.

Starting from its front side 3 and using a front reference for a front position, main longitudinal and transverse blind grooves 6A intersecting one another have been formed in the substrate wafer 2A, placed at the locations of the main through-passages 6 to be obtained and deeper than the thickness of the portions 5 to be obtained.

Inside the main grooves 6A, interior dielectric layers 9A are formed, which cover the sides and the base of the main grooves 6A, forming secondary longitudinal and transverse blind grooves 11A whose depth is greater than the thickness of the portions 5 to be obtained. Within the secondary grooves 11A, starting from the base and up to the front side 3, parts 12B made of a temporary material, for example a nitride of silicon, and parts 12a made of doped polysilicon are formed. According to another example, the parts 12B may be made of germanium.

The electronic circuits 18 and the front layer 19 including the network of electrical connections 20 are fabricated.

Figure 4:
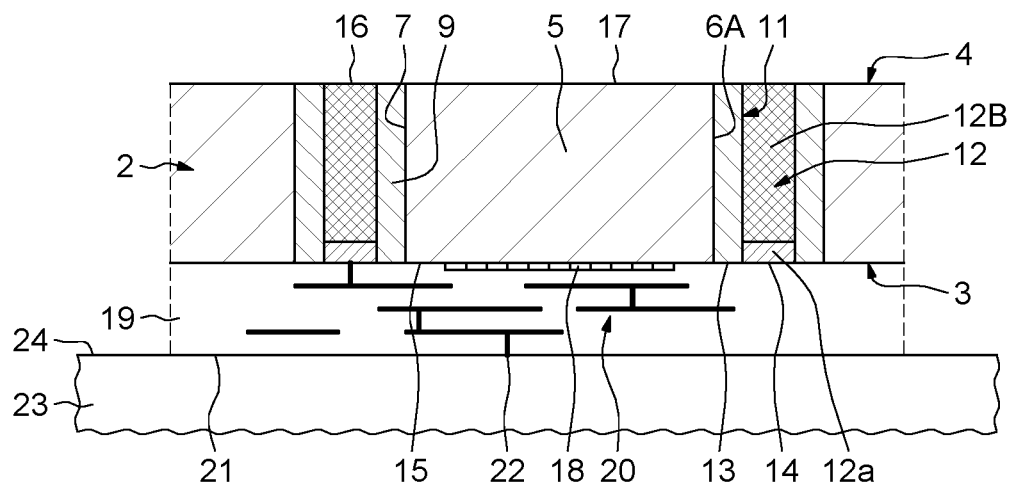

This having been done, as illustrated in FIG. 4, the device 1A has been installed on a support plate 23 in a position such that the front external face 21 of the front layer 19 is fixed onto the face 24 by a permanent bond.

Then, starting from the device 1A, thinning of the silicon substrate wafer 2A is carried out, removing a thickness from its back part and the base of the interior dielectric layers 9A, until the back faces 16 of the parts 12B made of silicon nitride are reached, forming thick portions 5 of the substrate wafer 2 and the dielectric layers 9. This operation has been carried out by chemical-mechanical polishing.

Figure 5:
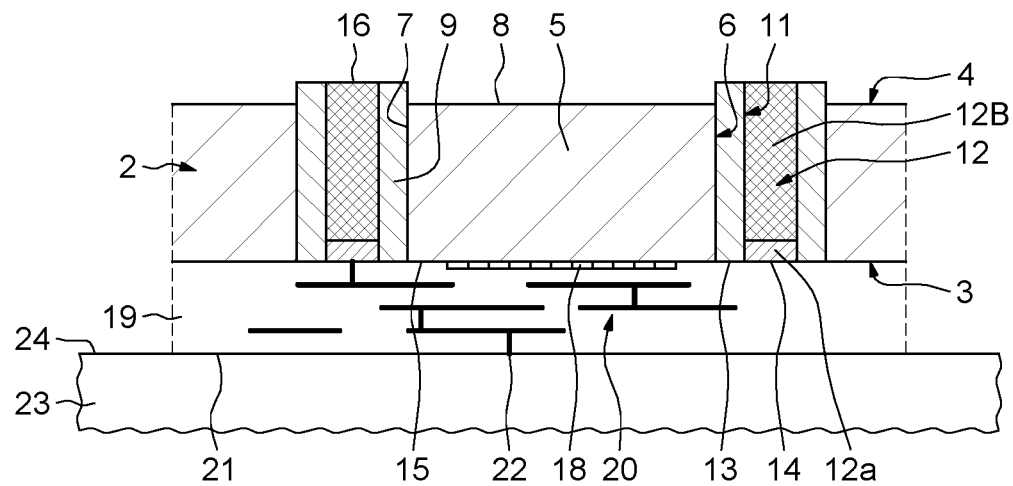

Then, as illustrated in FIG. 5, the thinning of the substrate wafer 1A has been continued until a thickness corresponding to the thickness of the substrate wafer 2 is obtained. Thinned portions 5 of the substrate wafer 2 and the main through-passages 6 of the device 1 to be obtained are thus formed. This operation has been carried out by a selective chemical etching of the silicon.

Figure 6:
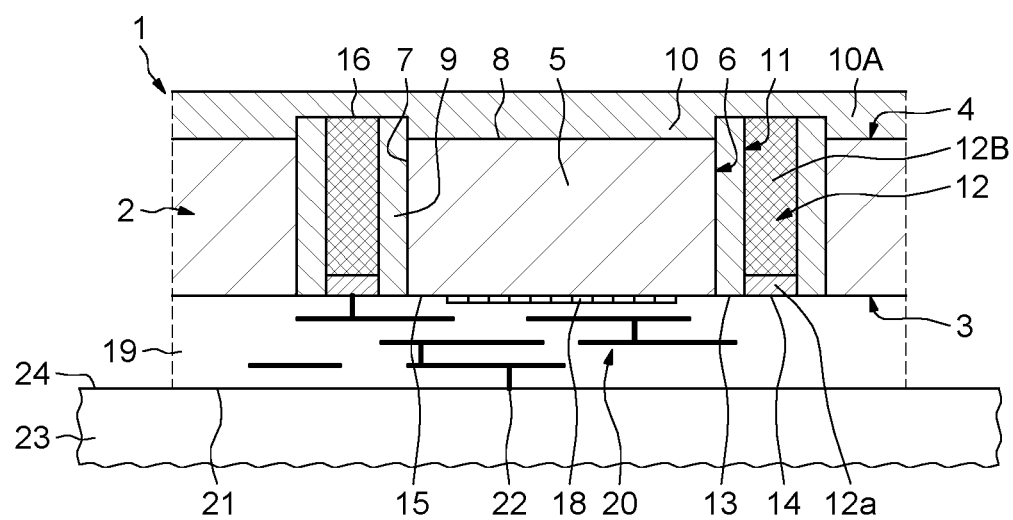

Then, as illustrated in FIG. 6, on the back faces 8 of the portions 5 of the substrate wafer 2 obtained and on the back ends of the remaining portions of the dielectric layers 9 and of the parts 12B made of silicon nitride, back dielectric layers 10A are formed by deposition, which layers are attached to the back ends of the remaining portions of the dielectric layers 9A.

Figure 7:
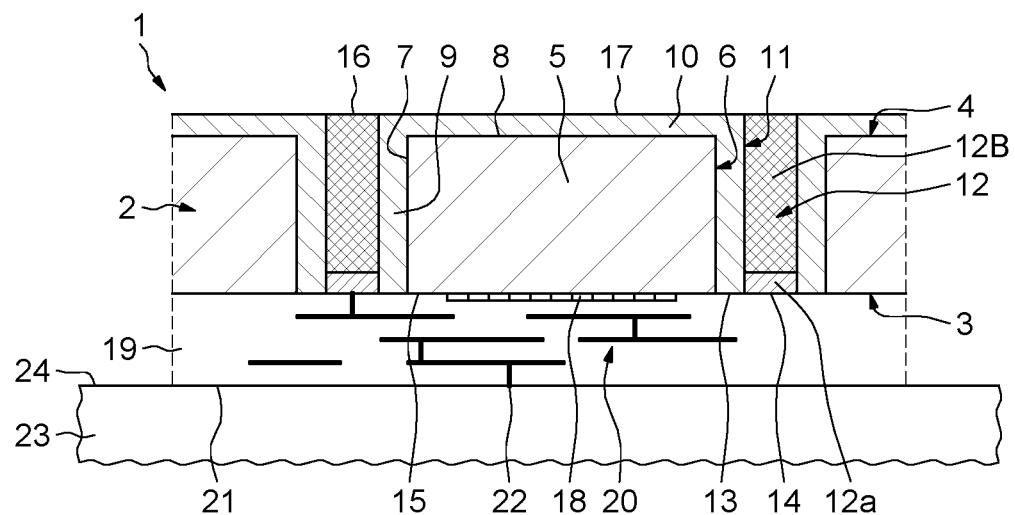

Then, as illustrated in FIG. 7, the back part of the back dielectric layer 10A of silicon oxide has been removed as far as the back face 16 of the parts 12B. This operation has been carried out by chemical-mechanical polishing. The interior dielectric layers 9 and the back dielectric layers 10 of silicon oxide, together with the secondary through-passages 11 of the device 1 to be obtained, are thus formed.

Figure 8:
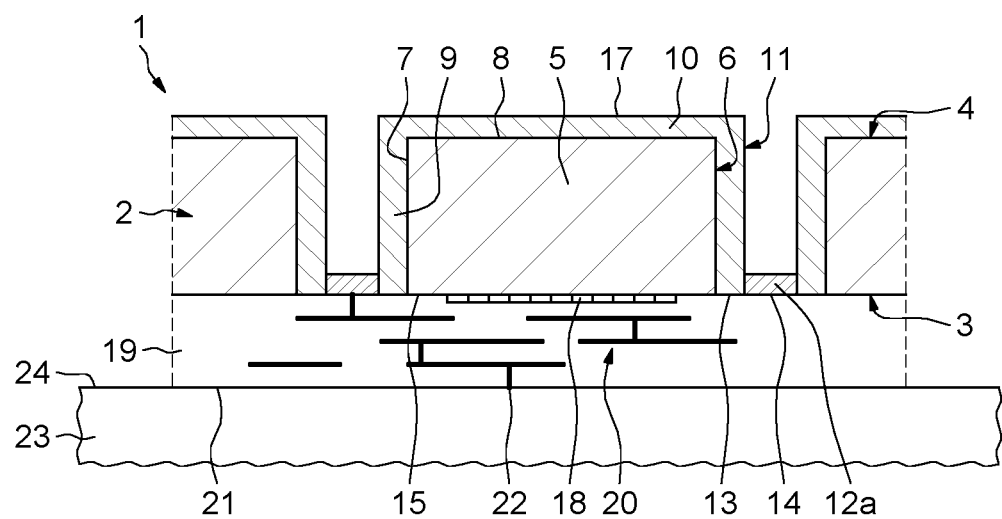

Then, as illustrated in FIG. 8, since the temporary material forming the back parts 12B has been chosen so as to be selectively removable with respect to the material of the layers 9 and 10, the temporary back parts made of silicon nitride 12B have been removed by a selective chemical etching of the silicon nitride, or other, as far as the front part 12a made of doped polysilicon which constitutes a barrier to the etching.

Figure 9:
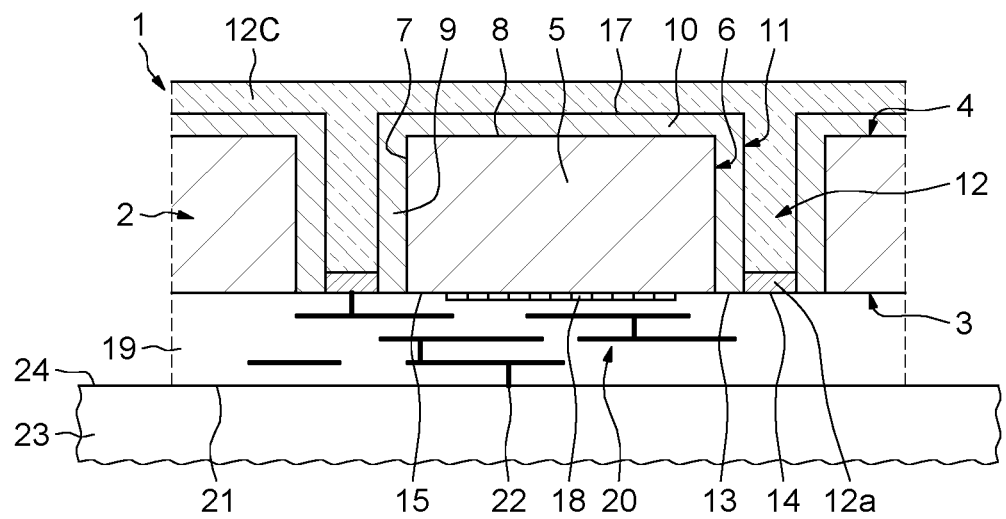

Then, as illustrated in FIG. 9, a back deposition 12C of tungsten has been carried out, which fills the holes left by the silicon nitride and forms a layer on the back faces 17 of the back dielectric layers 10 obtained.

Then, in order to obtain the electronic device 1 of FIG. 1, the back part of the layer of tungsten 12C has been removed, as far as the back faces 17 of the back dielectric layers 10 obtained. This operation has been carried out by chemical-mechanical polishing. The back parts 12b of the conductive fillings 12 are thus obtained, which determine the back face 16.

The bonding is definitive and the reinforcement constituted by the support plate 23, thus bonded, will serve as the mechanical support needed for the thinning step, then dicing, assembly and packaging.

According to another embodiment illustrated in FIG. 10, an electronic device 101, image sensor, differs from the electronic device 1 in the following ways.

The back dielectric layers 10 do not exist, the back faces of the portions 5 of the substrate silicon wafer 2 being exposed.

The interior dielectric layers 9 have back faces 102 in the plane of the back faces 8 of the portions 5 of the substrate silicon wafer 2.

The tungsten back parts 12b of the conductive fillings 12 have back faces 103 that are recessed towards the front with respect to the back faces 8 of the portions 5 of the substrate wafer 2.

The back spaces of the secondary through-passages 11, behind the back faces 103, are filled with back dielectric anti-diffusion layers 104, for example of silicon oxide, which meet the interior dielectric layers 9 and which have back faces 105 situated in the plane of the back faces 8 of the portions 5 of the substrate silicon wafer 2. The back dielectric anti-diffusion layers 104 form back plugs within the secondary through-passages 11, behind the tungsten back parts 12b of the conductive fillings 12.

In a similar manner to the electronic device 1 described with reference to FIGS. 1 and 2, the electronic device 101 provides a passivation of the internal interfaces and a mutual isolation between the pixels. In addition, the back parts 12b of the conductive fillings 12 and the portions 5 of the substrate wafer 2 do not both at the same time have exposed surfaces or regions, in such a manner that the tungsten forming the back parts 12b of the conductive fillings 12 cannot contaminate the silicon forming the portions 5 of the substrate wafer 2 due to the existence of the interior dielectric layers 9 and of the back dielectric layers 10 which form diffusion barriers.

The electronic device 101 may be fabricated in the following manner.

Figure 11:
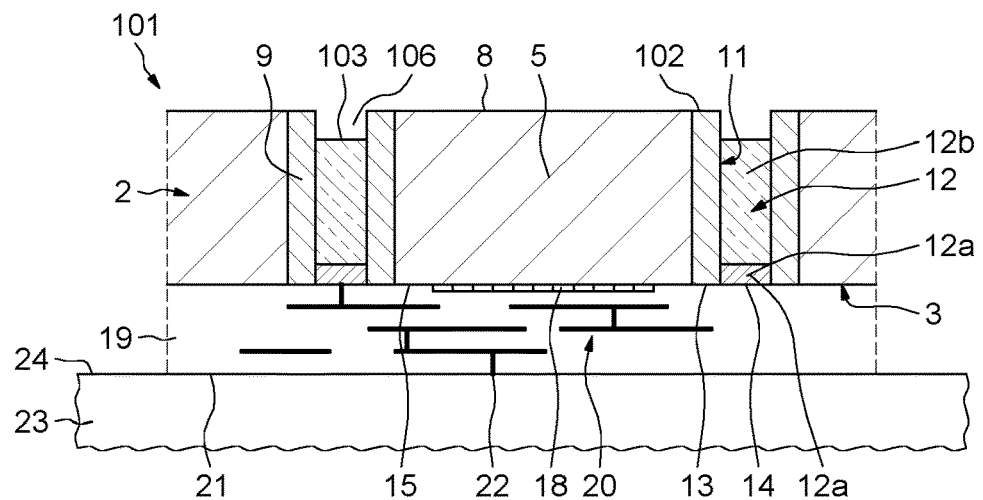
FIGS. 11 and 12 show transverse cross-sections of the electronic device in FIG. 10, according to fabrication steps.

As illustrated in FIG. 11, having fabricated the electronic device 1, the back dielectric layer 10 has been removed. Then, a back thickness of the tungsten back parts 12b has been removed, within the secondary through-passages 11, as far as the back faces 103 to be obtained, in such a manner as to obtain hollowed out back spaces 106. This operation has been carried out by a selective chemical etching of the tungsten.

Figure 12:
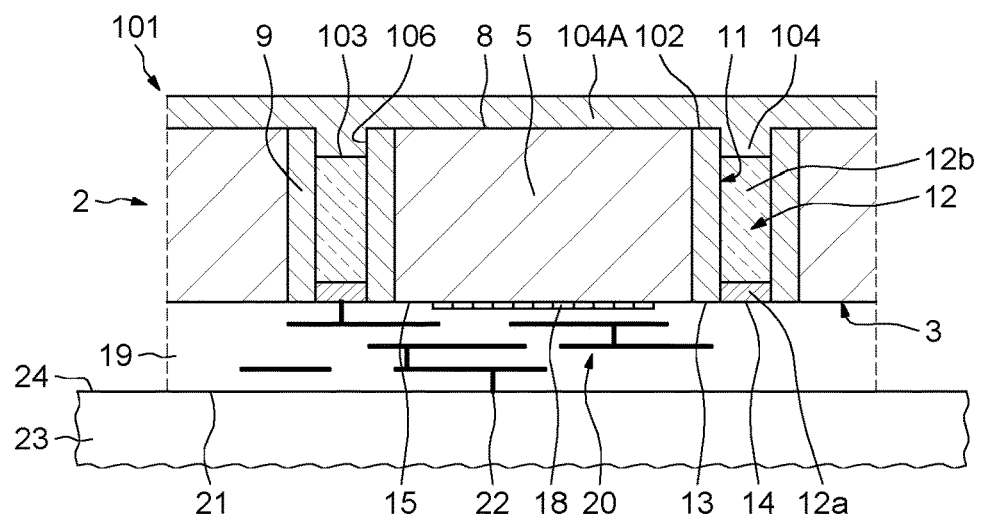

Then, as illustrated in FIG. 12, a dielectric complementary back layer 104A filling the back spaces 106 has been deposited covering the entire back face on top of the back faces 8 of the substrate wafer 2 and of the back faces 102 of the interior dielectric layers 9.

Figure 10:
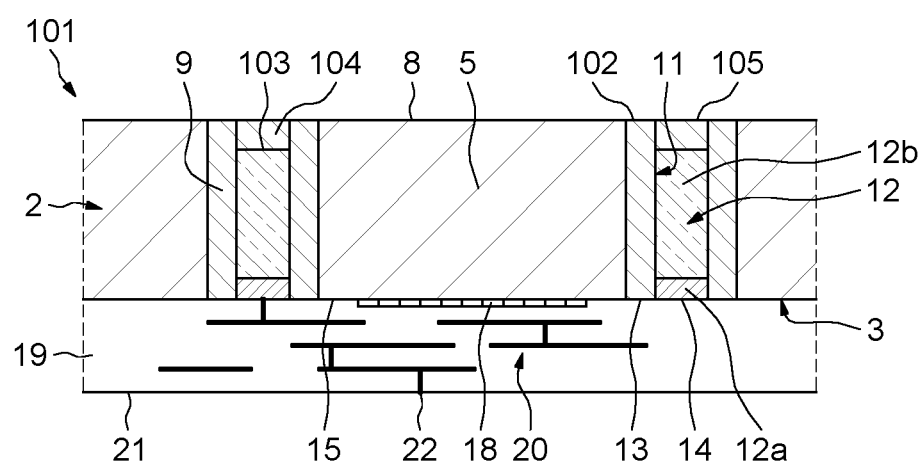
FIG. 10 shows a transverse cross-section of another electronic device.

Then, in order to obtain the electronic device 101 of FIG. 10, the dielectric complementary back layer 104A has been removed, as far as the plane of the back faces 8 of the portions of the substrate wafer 2, while leaving the back dielectric layers 104 intact. This operation has been carried out by chemical-mechanical polishing.

According to one variant embodiment, the back dielectric layers 104, forming back plugs in back portions of the secondary through-passages, could be of doped polysilicon.

Figure 13:
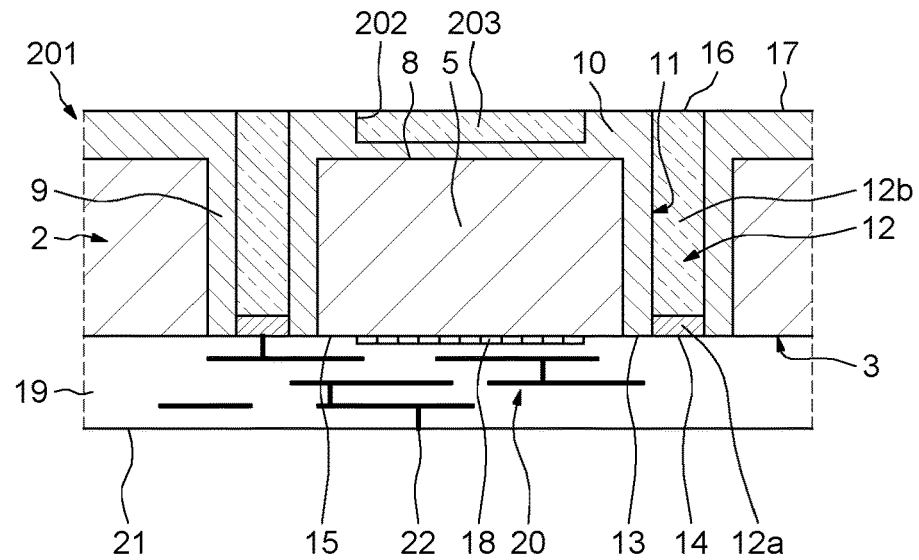
FIG. 13 shows a transverse cross-section of another electronic device.

According to another embodiment illustrated in FIG. 13, an electronic device 201, such as an image sensor, differs from the electronic device 1 in the following ways.

The back dielectric layers 10 have local back cavities 202 which are filled with back additional layers 203 of tungsten.

The local back cavities 202, and therefore the back additional layers 203, may have different dispositions.

According to the example shown, the local back cavities 202 extend behind the portions 8 of the substrate wafer 2, for example over an area corresponding to large parts of these portions 5. Since the local cavities 202 are separated from the secondary through-passages 11, the back additional layers 203 of tungsten are separated from the tungsten back parts 12b of the conductive fillings 12, in such a manner that the back additional layers 203 and the back parts 12b are electrically isolated.

According to another example (not shown), local back cavities 202 may extend as far as some of the secondary through-passages 11 such that the back additional layers 203 of tungsten meet tungsten back parts 12b of the conductive fillings 12, on one side or on either side, such that the back additional layers 203 and the back parts 12b are electrically connected. The back local additional layers 203 can then be electrically connected to other parts of the electronic device.

The back local additional layers 203, formed within the local back cavities 202, constitute a local optical masking. This optical masking is necessary in order to protect certain active regions (memory region of a pixel, single-shot pixel for example) from any undesirable illumination.

The electronic device 201 may be fabricated in the following manner.

Figure 14:
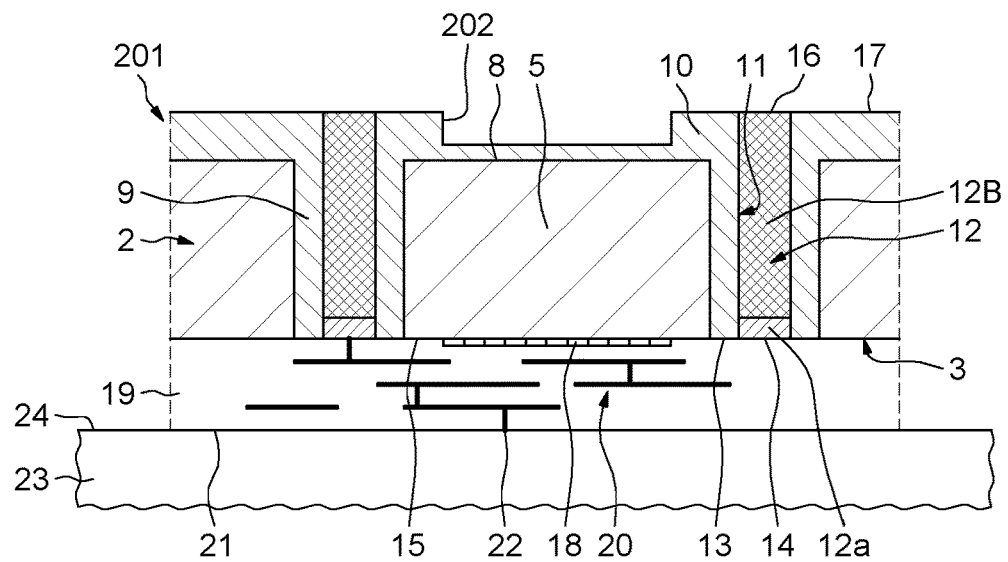
FIGS. 14 to 16 show transverse cross-sections of the electronic device in FIG. 13, according to fabrication steps.

As illustrated in FIG. 14, starting for example from the device illustrated in FIG. 7, obtained as previously described, the local back cavities 202 have been formed by etching of the back dielectric layer 10.

Figure 15:
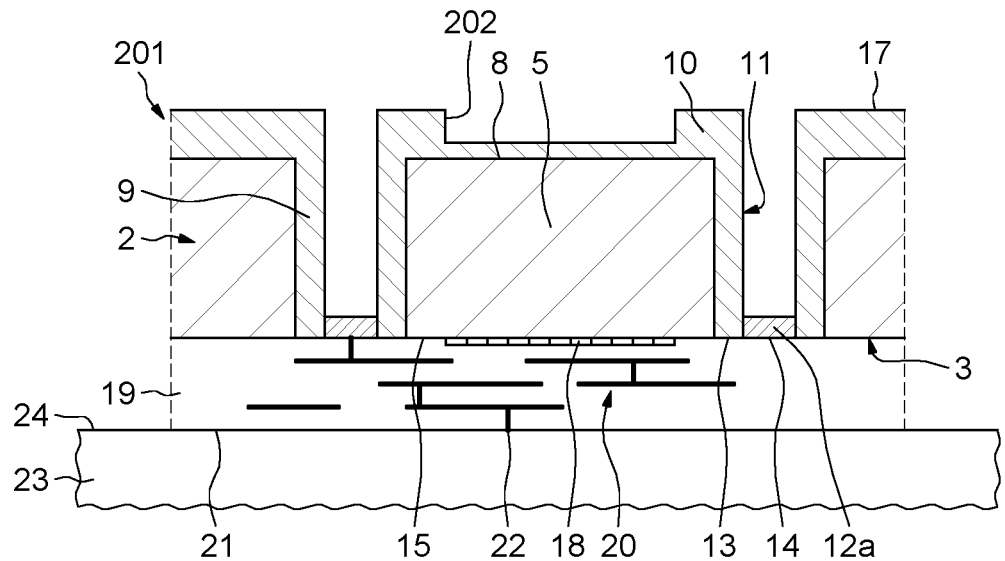

Then, as illustrated in FIG. 15, the temporary back parts made of silicon nitride 12B have been removed, in a manner equivalent to the operation described with reference to FIG. 8.

Figure 16:
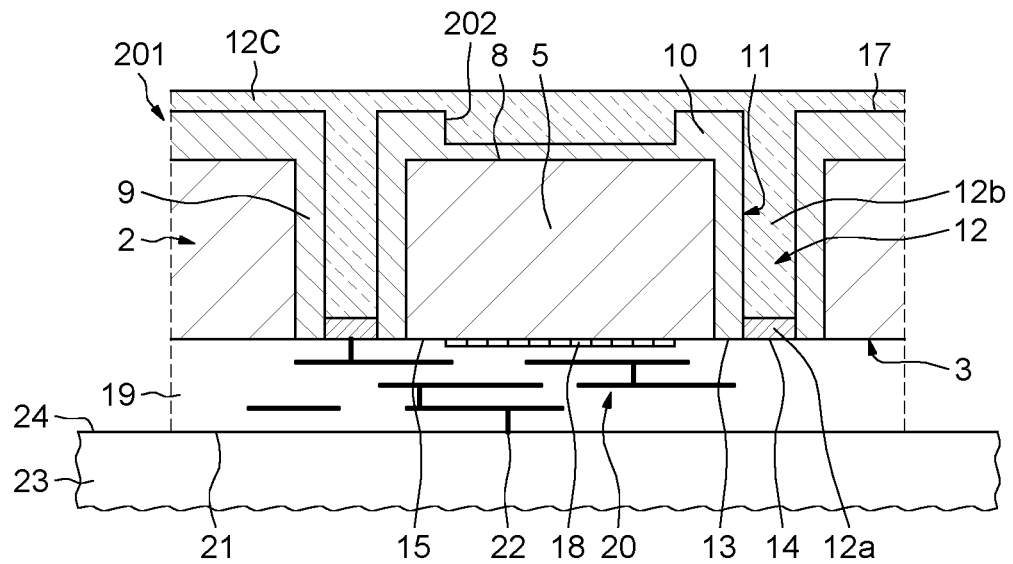

Then, as illustrated in FIG. 16, a backfill deposition 12C of tungsten has been carried out, which fills the holes left by the silicon nitride in the secondary through-passages 11 and the local back cavities 202 and forms a layer on the back faces 17 of the back dielectric layers 10, in a manner equivalent to the operation described with reference to FIG. 9.

Then, in order to obtain the electronic device 201 of FIG. 13, the back part of the layer of tungsten 12C is removed by chemical-mechanical polishing, as far as the back faces 17 of the back dielectric layers 10, in a manner equivalent to the operation described with reference to FIG. 9, this time leaving the back parts 12b in the secondary through-passages 11 and the local back layers 203 in the back cavities 202 intact. An aforementioned equivalent electronic device (not shown), in which the back additional layers 203 and the back parts 12b meet and are thus electrically connected, could be obtained in an equivalent manner.

According to another embodiment illustrated in FIG. 17, an electronic device 301 is based on the electronic device 1 in FIGS. 1 and 2, modified in the following manner.

The back dielectric layers 10 have local back cavities 302 which are filled with back additional layers 303 of tungsten, in such a manner that these back local additional layers 303 have portions which extend behind and are aligned with the secondary through-passages 11.

In a manner equivalent to what has been mentioned previously, these back additional layers 303 form back optical maskings.

Furthermore, the layers 12b of tungsten have back local faces 304 which are situated at a distance from back local additional layers 303 of tungsten.

Dielectric local layers 305, for example of silicon oxide, fill the gaps between the back local additional layers 303 and the back local faces 304, forming local plugs in local back portions 306 of the secondary through-passages 11, behind the back parts 12a of the conductive fillings 12.

Thus, the conductive fillings 12 and the back local additional layers 303 of tungsten, forming back optical maskings, are electrically isolated.

The electronic device 301 may be fabricated in the following manner.

Figure 18:
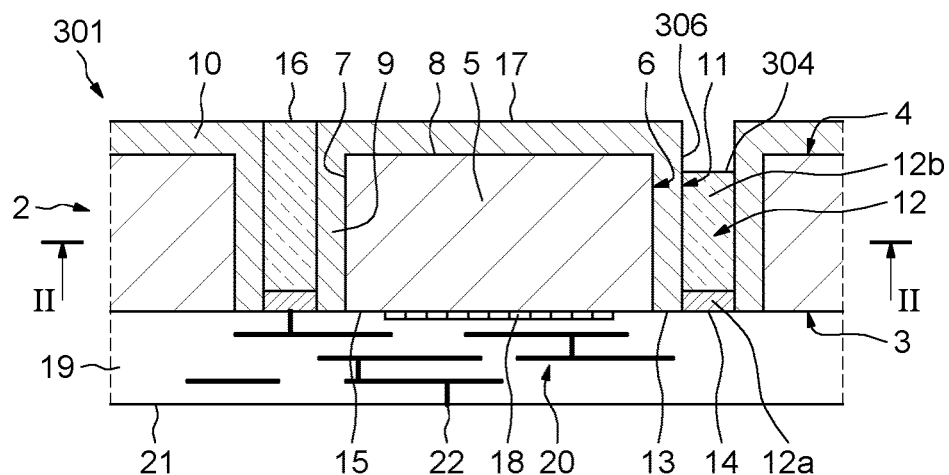
FIGS. 18 to 20 show transverse cross-sections of the electronic device in FIG. 17, according to fabrication steps.

As illustrated in FIG. 18, starting from the electronic device 1 of FIG. 1, local thinning of the tungsten parts 12b of the conductive fillings 12 has been carried out by chemical etching in such a manner as to obtain the recessed back faces 304.

Figure 19:
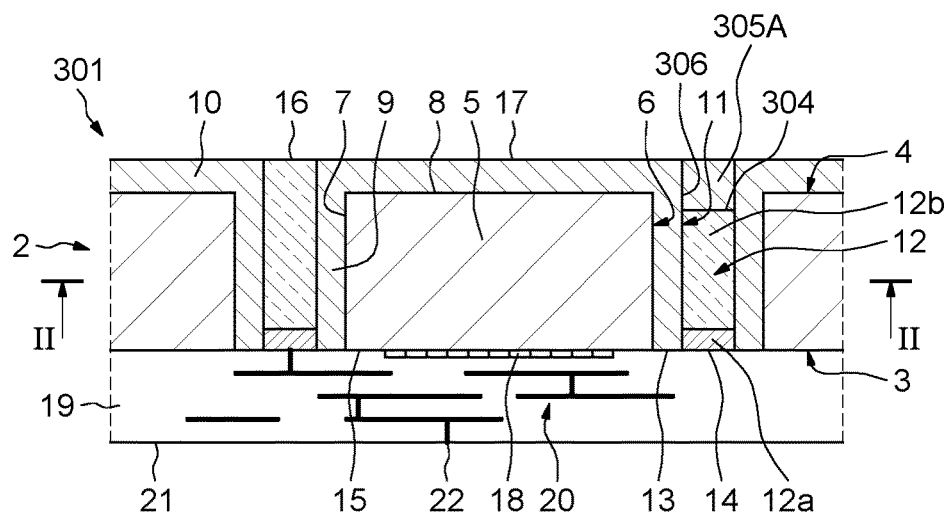

Then, as illustrated in FIG. 19, a back layer of silicon oxide has been deposited, which fills the spaces left in the back portions of the secondary through-passages 11, and a chemical-mechanical polishing has been carried out, so as to leave dielectric local layers 305A of silicon oxide intact in the back portions of the secondary through-passages 11.

Figure 20:
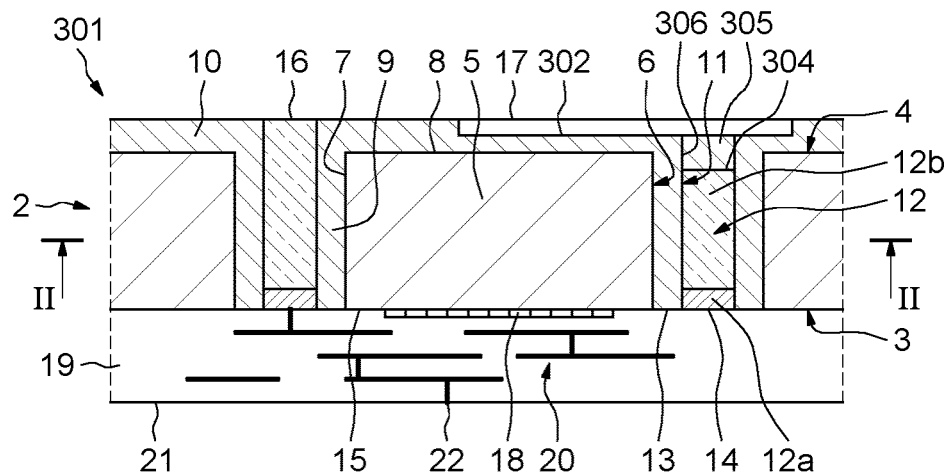

Then, as illustrated in FIG. 20, local back cavities 302 are formed by etching in the back dielectric layer 10 and the back parts of the dielectric local layers 305A of silicon oxide are removed by chemical etching, down to the bottom of the local back cavities 302, so as to obtain the dielectric back parts 305.

Figure 17:
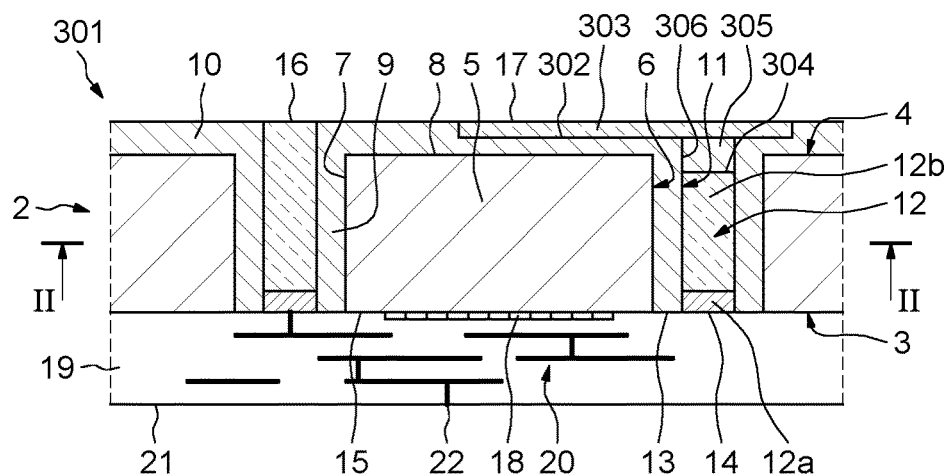
FIG. 17 shows a transverse cross-section of another electronic device.

Then, in order to obtain the electronic device 301 of FIG. 17, a back layer of tungsten has been deposited, filling the back local cavities 302, and a chemical-mechanical polishing has been carried out so as to obtain the back additional layers 303 in the back local cavities 302.

According to other embodiments, electronic devices may comprise combinations of the dispositions of the electronic devices previously described.

The invention claimed is:

1. An electronic device image sensor, comprising:
   a semiconductor wafer substrate having a front face and a back face and comprising semiconductor portions separated from one another by through-passages that extend completely through the semiconductor wafer substrate from the front face to the back face;
   electronic circuits located at the semiconductor portions;
   a dielectric layer including a network of electrical connections connected to said electronic circuits, the dielectric layer situated at the front face of the semiconductor wafer substrate and passing over said through-passages;
   a filling located within the through-passages, said filling comprising:
      a polysilicon part within the through-passages and extending from the front face towards the back face of the semiconductor wafer substrate; and
      a metal part within the through-passages in contact with the polysilicon part and extending from the polysilicon part towards the back face of the semiconductor wafer substrate;
      wherein the polysilicon part is connected to the network of electrical connections; and
   dielectric layers configured to provide for anti-diffusion of a metal material of the filling, said dielectric layers comprising:
      interior dielectric layers that are situated between sides of the semiconductor portions and the polysilicon and metal parts of the filling; and
      back dielectric layers that are joined to the interior dielectric layers and which cover the back face of the semiconductor wafer substrate.

2. The device according to claim 1, further including:
   local back cavities in the back dielectric layers; and
   local additional layers of metal in the local back cavities.

3. The device according to claim 2, wherein the local additional layers of metal contained within the local back cavities have portions offset from the through-passages.

4. The device according to claim 3, wherein the local additional layers of metal are electrically connected to the metal part within the through-passages.

5. The device according to claim 1, wherein the metal part of the fillings is made of tungsten.

6. The device according to claim 1, wherein the polysilicon part is made of doped polysilicon.

7. The device according to claim 1, wherein the dielectric layers are made of silicon oxide.

8. The device according to claim 1, wherein the electronic circuits comprise photodiodes.

9. The device according to claim 8, further including:
   local back cavities in the back dielectric layers; and
   local additional layers of metal in the local back cavities;
   wherein said local additional layers of metal form a local optical masking of the photodiodes at the back face of the semiconductor wafer substrate.

10. An electronic device image sensor, comprising:
   a semiconductor wafer substrate having a front face and a back face and comprising semiconductor portions separated from one another by through-passages that extend completely through the semiconductor wafer substrate from the front face to the back face;
   electronic circuits located at the semiconductor portions;
   a dielectric layer including a network of electrical connections connected to said electronic circuits, the dielectric layer situated at the front face of the semiconductor wafer substrate and passing over said through-passages;
   a filling located within the through-passages, said filling comprising:
      a polysilicon part within the through-passages and extending from the front face towards the back face of the semiconductor wafer substrate; and
      a metal part within the through-passages in contact with the polysilicon part and extending from the back face of the semiconductor wafer substrate towards the front face to make contact with the polysilicon part;
      wherein the polysilicon part is connected to the network of electrical connections; and
   dielectric layers configured to provide for anti-diffusion of a metal material of the filling into the semiconductor portions of the semiconductor wafer substrate, said dielectric layers comprising:

interior dielectric layers that are situated between sides of the semiconductor portions and the polysilicon and metal parts of the filling; and back dielectric layers that are joined to the interior dielectric layers and which further are located within the through-passages extending from the back face towards the front face and in contact with the metal part.

11. The device according to claim 10, wherein the back dielectric layers cover the back face of the semiconductor wafer substrate.

12. The device according to claim 10, further including:
local back cavities in the back dielectric layers; and
local additional layers of metal in the local back cavities.

13. The device according to claim 12, wherein the local additional layers of metal contained within the local back cavities have portions aligned with the through-passages and are separated from the electrically conductive fillings by portions of said local back dielectric layers located within the through-passages.

14. The device according to claim 10, wherein the metal part of the fillings is made of tungsten.

15. The device according to claim 10, wherein the polysilicon part is made of doped polysilicon.

16. The device according to claim 10, wherein the dielectric layers are made of silicon oxide.

17. The device according to claim 10, wherein the electronic circuits comprise photodiodes.

18. The device according to claim 17, further including:
local back cavities in the back dielectric layers; and
local additional layers of metal in the local back cavities;
wherein said local additional layers of metal form a local optical masking of the photodiodes at the back face of the semiconductor wafer substrate.

* * * * *